US006245827B1

(12) United States Patent
Gregory

(10) Patent No.: US 6,245,827 B1
(45) Date of Patent: Jun. 12, 2001

(54) ULTRAVIOLET CURABLE RESIN COMPOSITIONS HAVING ENHANCED SHADOW CURE PROPERTIES

(75) Inventor: Scott Gregory, Rockaway, NJ (US)

(73) Assignee: Elementis Specialties, Inc., Highstown, NJ (US)

( * ) Notice: Subject to any disclaimer, the term of this patent is extended or adjusted under 35 U.S.C. 154(b) by 0 days.

(21) Appl. No.: 09/415,079

(22) Filed: Oct. 12, 1999

(51) Int. Cl.$^7$ ................. C08F 2/50; C08F 4/34; C09D 163/00; C09D 67/07
(52) U.S. Cl. ................. 522/13; 522/15; 522/24; 522/25; 522/120; 522/129; 522/141; 522/146; 522/170; 522/181; 526/332; 526/333; 528/393; 528/405; 528/406; 528/408; 528/418; 528/421
(58) Field of Search ................. 522/13, 15, 24, 522/25, 170, 129, 146, 141, 120, 181; 528/393, 405, 406, 418, 421, 408; 526/332, 333

(56) References Cited

U.S. PATENT DOCUMENTS

| 4,593,051 | * | 6/1986 | Koleske . |
| 4,593,052 | * | 6/1986 | Irving . |
| 4,892,764 | * | 1/1990 | Drain et al. . |
| 4,916,805 | * | 4/1990 | Ellrich et al. . |
| 5,384,339 | * | 1/1995 | Starkey . |
| 5,393,818 | * | 2/1995 | Masse et al. . |
| 5,445,855 | * | 8/1995 | Tokita et al. . |
| 5,679,719 | * | 10/1997 | Klemarczyk et al. . |

* cited by examiner

*Primary Examiner*—Susan W. Berman
(74) *Attorney, Agent, or Firm*—Michael J. Cronin

(57) ABSTRACT

This invention is of a resin composition including an additive of one or more organic peroxide thermal imitators to cationic photoinitiators, that are sensitized with alpha-hydroxy-ketones, which composition provides a self-propagating thermal curing reaction first activated by a short duration of surface ultraviolet radiation. The thermal reaction is non-directional, thus eliminating the line of sight limitation of current radiation curing processes. Complete curing can be achieved of the composition in a very short time; often after only a few minutes or less. The activation period can be provided by only a few seconds of ultraviolet light using a wide variety of commercial ultraviolet light sources.

17 Claims, No Drawings

ULTRAVIOLET CURABLE RESIN COMPOSITIONS HAVING ENHANCED SHADOW CURE PROPERTIES

BACKGROUND OF THE INVENTION

1. Field of the Invention

The present invention is directed toward improved liquid ultraviolet (UV) resin compositions that comprise resin compounds blended with several defined additional chemicals. The inventive compositions have the property that when the composition is subject to ultra violet light the composition cures to a solid throughout the volume of the entire composition. This property permits the composition to be useful in applications where the possibility of exposing all of the area (and the volume beneath) of the composition to ultraviolet radiation is not present. This cure process, which continues the cure by using a trigger mechanism provided by the ultraviolet light, has been termed shadow cure. The present invention cures into areas which have no exposure to light by use of novel and surprising chemistry.

These resin compositions have enhanced properties that make them desirable materials for an ever-growing number of commercial uses. These uses include:

(a) Industrial uses such as sealing material for coils and printed circuit boards, potting compounds and sealing compounds generally and as adhesives, (b) Surgical and medical uses such as sealing of medical equipment containing electronic components, (c) A variety of automotive manufacture uses including industry potting and sealing of various automotive components, and (d) Electronic uses where tight and reliable sealing are required including encapsulation of electronic components and parts.

Advantages of the Instant Invention Include:

(a) Ease of use as a one component product not requiring on-site mixing of two or more components, (b) Reduced volatile organic compounds (VOC) released into the atmosphere, (c) Rapid, deep and complete cure throughout the entire volume of the resin composition upon application of ultraviolet light and without the necessity of on-site heating.

2. Background of the Invention

Resin compositions which cure by exposure to ultraviolet radiation are known in the art. Such compositions found in actual commercial usage today, however, in the fields discussed above are very few. An even smaller number of such compositions are known to the art which completely cure by brief exposure to ultraviolet radiation in areas not reached by such light.

3. Description of the Prior Art

Some prior art of interest is discussed below for background.

Reactions between epoxides and compounds having aliphatic hydroxyl groups have been known. Such reactions have been generally carried out at elevated temperatures by heating the reactants in the presence of basic or acid catalysts. For example, U.S. Pat. No. 2,914,490 describes the thermal reactions of a variety of epoxides with different types of polyols including copolymers containing reactive hydroxyl groups. Such reactions proceed very slowly in the presence of a catalyst at room temperature with elevated temperatures necessary to get reasonable reaction rates and useful properties.

U.S. Pat. No. 3,450,613 disclosed photopolymerizable epoxy compositions comprising the reaction product of an epoxy resin prepolymer and an ethylenically unsaturated organic acid, a photosensitizer, and optionally polyfunctional acids or bases. On exposure to ultraviolet light there is a photoinduced polymerization of the ethylenically unsaturated portion of the reaction product. The cure of the composition is completed by outside heating to bring about reaction of the epoxy resin portion of the composition. Compositions such as this, and commercial products using their type of mechanism, have very poor usefulness because of the requirement of both light and heat to effect a complete polymerization cure of the entire composition. Such compositions are often oxygen sensitive and usually have very poor thermal stability.

U.S. Pat. No. 4,256,828 describes photocopolymerizable compositions which contain epoxides, organic material with hydroxyl functionality and a photosensitive aromatic sulfonoic or iodonium salt of a halogen containing complex ion. U.S. Pat. No. 5,837,398 refers to U.S. Pat. No. 4,256,828 and describes a battery sealant composition which does not require an organic solvent.

U.S. Pat. No. 4,699,802 shows a dual curing coating method using liquid silicones curable by ultraviolet light on a substrate having no readily accessible areas to direct UV light using a process of first, irradiation, and then exposing the radiated composition to a moisture cure. See also U.S. Pat. No. 5,008,301 which shows a three mechanism curing system using separate light, heat and moisture outside mechanisms.

U.S. Pat. No. 5,017,406 describes an UV curable composition cured with polysilane with a peroxide photoinitiator. Peroxides used include dibenzoyl peroxide and hydrogen peroxide.

U.S. Pat. No. 5,712,231, in a description of the prior art, states that heat-activated peroxides may have been added to acrylic, exoxy, silicone and polyurethane systems but could not be used where heat sensitive electronic components are involved.

There has long been a need for a thermally stable, one-part, photocurable resin compositions, such as epoxy compositions, which provides a flexible or solid coating and an assured complete cure and seal. Such composition has not heretofore been provided by the many artisans working in the field.

OBJECT AND SUMMARY OF THE INVENTION

Object of the Invention:

It is an object of the invention to provide a liquid resin product which upon activation by ultra violet light will cure into a solid or a flexible solid throughout its entire volume including that volume not reached by the ultra-violet light.

It is a specific object of the invention to provide commercial curable one component resin compositions useful for sealing structures where a substantial portion of the resin composition is shielded behind structures and components, and not therefore reachable by light.

SUMMARY OF THE INVENTION

The present invention is a resin composition which possesses an enhanced shadow cure chemistry mechanism, i.e., the composition cures by exposure to ultraviolet radiation throughout its entire volume without the need for any other outside stimuli.

The invention concerns an ultraviolet radiation curable composition having enhanced cure properties activated from an initial ultraviolet radiation by internally generated heat into areas shadowed. The composition is a stable, storable liquid at room temperatures and, upon activation by ultraviolet light, turns into a hard or flexible solid material throughout its entire volume.

In a preferred embodiment, this invention is of a resin composition including an additive of one or more organic peroxide thermal initiators to dialkyl iodonium salt cationic photoinitiators, that are sensitized with one or more alpha-hydroxy-ketones. The composition provides a self-propagating thermal curing reaction first activated by a short duration of ultraviolet radiation at its surface. The thermal reaction is non-directional, thus eliminating the line of sight limitation of current ultraviolet radiation curing processes. Complete curing of the composition can be achieved in a very short time; often after only a few minutes or less. The activation period can be provided by only a few seconds of ultraviolet light using a wide variety of commercial ultraviolet light sources.

The ultraviolet radiation polymerization and cross linking of epoxy and vinyl ether resins, for example, by current cationic photoinitiator chemistry has, up to now, been limited to thin coatings of usually less than 0.06 in. thick, and even less if the composition is pigmented. These current product and processes suffers from line of sight limitations, in that the resin composition not directly illuminated with ultra violet light does not cure.

The inventive product, in comparison with the known commercial art, uses activation by ultraviolet light and by use of a chemistry process available in situ results in the surface UV irradiation step activating a chemical curing process.

This curing process produces an ongoing exothermic reaction that propagates the resin, curing to greater depths then is currently possible with known chemistries. This process has at least two major advantages, it allows thorough cure in opaque resins, and it eliminates the line of sight limitation of existing products by use of an UV triggered exothermic reaction which spreads throughout the entire composition.

In a preferred aspect, the composition uses dialryl iodonium salts in combination with alpha-hydroxy-ketone photoinitiators to increase the ultra violet activated polymerization. This causes a sufficient exothermic reaction to decompose a organic peroxide thermal initiator. The free radicals generated from the peroxide further reduce the iodonium salt producing Lewis acid which further polymerizes the resin and creates a self propagating exothermic polymerization reaction, which continues until a complete cure is accomplished.

The present invention provides a single-component system that will be room temperatures stable for months.

Further advantages and features of the invention, as well as the scope, nature and utilization of the invention, will become apparent to those of ordinary skill in the art from the description of the preferred embodiment of the invention set forth below.

DESCRIPTION OF THE PREFERRED EMBODIMENTS

The compositions of this invention may be made using a variety of materials and by a variety of methods disclosed hereafter, or which will appear obvious when the disclosure of this patent occurs. Applicant does not intend to limit the materials or methods of manufacture of such additives by the following descriptions.

One important aspect of the invention is a liquid ultraviolet curable resin composition comprising:

a) A liquid resin selected from the group consisting of cycloaliphatic expoxides and vinyl ethers, and mixtures thereof with epoxy polyolefins ethers;

b) When component a) contains a cycloaliphatic expoxide, a hydroxy-functional material that will react with the liquid resin of element a) upon the application of an ultraviolet light stimulus;

c) One or more cationic photoinitiators preferably one or more iodonomium salts that produce Lewis acid upon the application of ultraviolet light or thermal heating;

d) A sensitizer material which sensitizes component c) to increase its reactivity and e) An organic peroxide that has a ten hour half life at about 65° C. to 110° C.

The resin composition of this invention can also contain other materials known to be incorporated in ultraviolet curable resin compositions e.g. plastiziers, pigments, Theological additives and colorants.

Resins useful for component a) are well known in the art and are commercially available from a variety of sources. Representative preferred resins useful in accordance with the present invention are the following:

1) cycloaliphatic epoxides—epoxides particularly useful in the compositions of the invention are one or more organic compounds having an oxirane ring polymerizable by ring opening. Such materials contain one or more reactive groups resulting from the union of an oxygen atom with two stressed carbon atoms in a ring structure that are joined as follows:

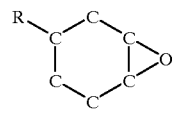

Such cycloaliphatic epoxides include monomeric epoxy compounds and epoxides of the polymeric type. These materials generally have, on the average, at least 1.0 polymerizable epoxy groups per molecule (preferably two or more epoxy groups per molecule). The epoxides may be pure compounds but are generally mixtures containing one, two or more epoxy groups per molecule. The "average" number of epoxy groups per molecule is determined by dividing the total number of epoxy groups in the epoxy-containing material by the total number of epoxy molecules present.

Useful cycloaliphatic epoxide materials include those which contain cyclohexene oxide groups such as the epoxycyclohexanecarboxylates, typified by 3,4-epoxycyclohexylmethyl-3,4-epoxycyclohexane carboxylate and bis(3,4-epoxy-6-methylcyclohexylmethyl) adipate.

Such expoxides may vary from low molecular weight monomeric materials to high molecular weight polymers and may vary greatly in the nature of their backbone and substituent groups. Mixtures of various epoxides materials can also be used in the compositions of this invention.

Examples of epoxides of the type which can be used in the practice of this invention are described in "Handbook of Epoxy Resins" by Lee and Neville, McGraw-Hill Book Co., New York (1967).

More specifically, Union Carbide is a major United States manufacturer of cycloaliphatic expoxides useful for this invention commercially sold under the trademark Cyracure. Degussa Corporation also offers cycloaliphatic epoxides useful for this invention sold mostly in Europe. ERL 4221 from Union Carbide (3,4 epoxycyclohexyl methyl-3,4-epoxycyclohexane carboxylate) was particularly useful.

2) Vinyl ethers—compositions useful in this invention are materials having at least one group containing a double bond followed by oxygen as follows:

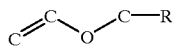

One type of preferred vinyl ethers to be used in the present invention are those made by ISP, a subsidiary of GAF, under the Rapi-cure trade name. Particularly useful are those containing dual functionability of vinyl ether groups and hydroxyl groups on the same molecule.

Other particularly useful vinyl ethers are hydroxy butyl vinyl ether and cyclohexane dimethanol monovinylether. Also useful are cyclohexane dimenthanol divinylether and propenyl ether of propylene carbonate. Vinyl ethers from Allied Signal sold under the tradename Vectomer are also useful particularly including VE 4010 (1,3-benzenedicarboxylic acid, bis[4(ethenyloxy)butyl]ester) and VE 4200 (pentanedioc acid, bis[4-(ethenyloxy)methyl, cyclohexyl]methyl]ether as well as higher oligomers sold as VE 1214 and VE 1312.

3) epoxy polyolefins—these compounds include polyolefin resins having an epoxy function which can consist of polyethylenes, polypropylenes, polybutylenes, polymethylpentane, polyisoprenes and copolymers thereof; copolymers of olefins and other monomers such as ethylene-vinyl acetate, ethylene acid copolymers and ethylene-vinyl alcohols. Also found useful are epoxidized natural oils such as soybean oil and linseed oil, epoxidized polybutenes polyglycol epoxy resins, bis A-based epoxy resins and epoxy novalac resins.

Materials particularly useful in the inventive compositions found effective for the exothermic reaction were the Elf Atochem line of Vikolox epoxy polyofelfins including Vikolox 16 ($C_{16}H_{32}O$), Dow Chemicals line of D.E.R. polyglycol resins and Union Carbide line of Cyracure products including, 1,2-epoxyhexadecane. Also found useful were the Dow D.E.N. line of epoxy novalac resins and Dow's D.E.N. line of Bis A-based epoxy resins.

Compound(s) (b) of the invention are used when compound (a) contains a cycloaliphatic expoxide and can be any hydroxyl functional chemical or material that will react with compound a) to form a solid reaction product. Any polyol with primary or secondary hydroyl functionality is suitable. Also useful would be a triol or higher polyol with three or more functional groups. The hydroxyl-containing material, which can be used in the present invention, may be any liquid or solid organic material having hydroxyl functionality of at least 1, and preferably at least 2 or more.

Generally, the hydroxyl-containing material should be free of groups which may be thermally or photolytically unstable; that is, the material should not decompose at temperatures below about 100° C. or in the presence of ultraviolet light encountered during the desired curing conditions for the resin inventive composition.

Preferably the material contains two or more primary or secondary aliphatic hydroxyl groups (i.e., the hydroxyl group is bonded directly to a non-aromatic carbon atom). The hydroxyl group may be terminally situated, or they may be pendent from a polymer or copolymer. The molecular weight (i.e., number average molecular weight) of the hydroxyl-containing organic material may vary from very low (e.g., 31) to very high (e.g., one million or more). The equivalent weight (i.e., number average equivalent weight) of the hydroxyl-containing material is preferably in the range of about 31 to 5000. When materials of higher equivalent weight are used they tend to reduce the rate and extent of copolymerization.

Representative examples of suitable materials having a hydroxyl functionality of 1 include alkanols, monoalkyl ethers of polyoxyalkyleneglycols, monoalkyl ethers of alkylene-glycols, and others known to the art.

Other examples of useful polymeric hydroxy-containing materials include polyoxyethylene and polyoxypropylene glycols; polytetramethylene glycols; copolymers of polyvinylacetal compounds containing pendent hydroxyl groups, cellulosic polymers such as hydroxyethylated and hydroxypropylated cellulose; hydroxy-terminated polyesters, hydroxy-terminated polyacetones; hydroxy-terminated silicones and hydroxy-terminated polyalkadienes.

Specific materials found particularly useful for compound b) are polycaprolactones such as the Tone line of Union Carbide such as TONE 0301 and TONE 305, polyoxypropylene glycols such as LHT 240 from Union Carbide and Dupont's line of polytetramethlyene glycols such as TER-ATHANE 650.

The amount of the hydroxyl-containing organic material used in the compositions of the invention may vary over broad ranges, depending upon factors such as the compatibility of the hydroxyl-containing material with the epoxide resin material, the equivalent weight and functionality of the hydroxyl-containing material, the physical properties desired by the customer in the final cured composition and the required time and speed of curing. A preferred ratio of the cycloaliphatic portion of component a) to component b) varies between 1.5 to 1 to 10 to 1.

Mixtures of hydroxyl-containing materials may be used, when desired. For example, one may use mixtures of two or more poly-functional hydroxy materials.

Component c) is one or more cationic photoinitiators. The photoinitiators which are most useful in the compositions of the invention are cationic chemicals including iodonium salts and sulfonium salts. Preferably useful iodonium salts are aromatic salts including diaryl iodonium hexafluoroantimonate.

The cationic photoinitiator initiates the reaction of the epoxy functionality on the resin mostly at the surface of the composition when light is applied. The cationic photoinitiator, upon irradiation with ultraviolet light, generates a superacid (Lewis acid) which catalyzes the cationic cure process. The acid, which is generated in the photolysis step, reacts with the epoxy functional material adding a proton to the epoxy group. After rearrangement, this positively charged species then further reacts with an additional mole of epoxy, leading to further propagation of the growing polymer chain. In the presence of compounds containing hydroxyl groups, a chain transfer reaction takes place.

Exemplary types of commercially available, suitable, functional photoinitiators useful in this invention include Sartomer's Sarcat CD-1012 and a chemically similar product made by General Electric.

Component d) is a sensitizer material which can be any chemical which sensitizes the above described photoinitiators to increase their reactivity, and to a deeper penetration, and thereby increase reduction of the iodinium salt into Lewis acid. Such compounds normally absorb ultraviolet light over a broader wave length range than the cationic photoinitiators previously discussed. Such materials break down into hydroxy functional free radicals which then directly reduce the iodinium salt into Lewis acid thereby generating Lewis acid at both a deeper penetration of light and over a broader light wavelength.

Materials found particularly useful include alpha-hydroxy-ketones. Particularly effective are 1-hydroxylcyclohexyl ketone ($C_{13}H_{16}O_2$) and 2-hydroxyl-2-methyl-phenyl-propane-1 ketone ($C_{10}H_{12}O_2$). DAROCUR 1173 and IRGACURE 184, both provided by CIBA-GEIGY, are particularly useful.

Component e) is an organic peroxide that has a ten hour half life of about 65° to 110° C. Any compound having an organic moiety containing a bilvalent O—O group which releases oxygen can be used with compounds having closed carbon ring groups being most preferred. This material maintains an ongoing chemical reaction after the photoinitiator is activated by ultra violet light. Such light generates sufficient exotherm heat to initially decompose the peroxide.

The heat of polymerization, thermally decomposes the peroxide generating a free radical which further reduces the iodium salt to Lewis acid. The Lewis acid reacts with the resin not yet cured and generates additional heat to decompose more peroxide. The heated peroxide thus continues the reduction of the iodinium salt (after the ultraviolet light source is removed) by the continuing generation of free radicals which continue the reduction of the salt to Lewis acid until the entire epoxy or vinyl ether is reacted throughout the entire composition.

Particularly useful organic peroxides include 1,1-di(t-butylperoxyl cyclohexane) and 1,1-di-(t-amyperoxyl-cyclohexane). Specific examples of useful commercial peroxides include LUBRIZOL 331-80B and LUBRIZOL 531-80B made by Elf-Atochem.

Without intending to be bound by theory, or limited to the specific chemicals used, what follows is a theoretical rendering of the reaction process of the components of this invention upon activation by ultraviolet light:

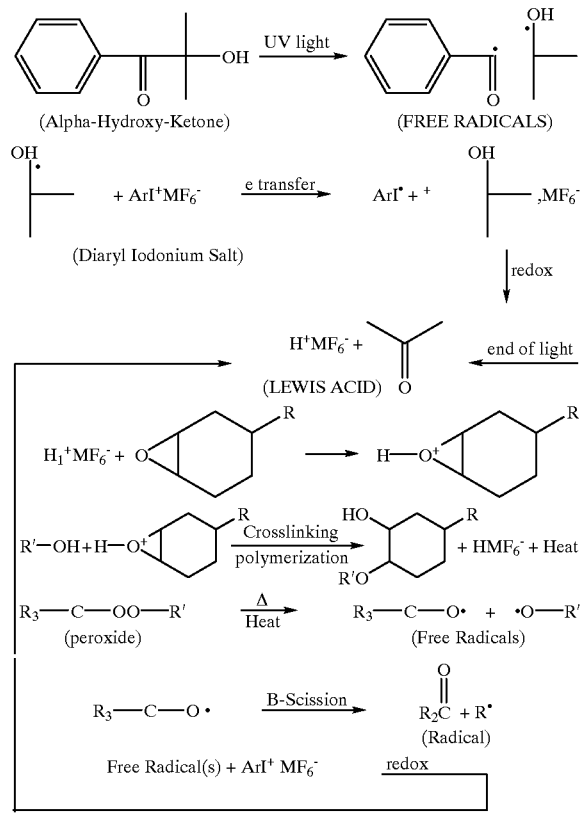

A preferred composition for purposes of the instant invention is comprised of a liquid ultraviolet curable resin composition comprising:
a) from 25 to 95% by weight of a liquid resin selected from the group consisting of cycloaliphatic expoxides, vinyl ethers and mixtures thereof with epoxy polyolefins;

b) when component (a) contains a cycloaliphatic epoxide, from 1 to 70% by weight of a hydroxy-functional material that will react with the liquid resin of component a);

c) from 0.1 to 10% by weight of one or more cationic photoinitiators that produce Lewis acid upon the application of ultraviolet light;

d) from 0.1 to 5.0% by weight of a sensitizer material which sensitizes component c) to increase its reactivity and e) from 0.2 to 5.0% by weight of an organic peroxide that has a ten hour half-life of about 65° C. to 110° C.

The compositions of this invention can be prepared as a blend or mixture of the individual components using standard laboratory or production equipment. The chemicals can be added in any order. Mixing apparatus, well known in the art, can be utilized to achieve a complete mixture.

The present invention is further illustrated by the following examples. All parts and percentages are by weight unless otherwise specified.

EXAMPLE 1

To increase the reactivity and thus the cure depth of an epoxy/polyol blend with CD1012 in combination with alpha-hydroxy-ketone, the use of thermal decomposing peroxide initiators were evaluated to determine if they can produce free-radicals that will further reduce the diaryl Iodonium antimonate salt to Lewis acid.

The heat needed to decompose the peroxide was provided by the initial exotherm from the ultraviolet initiated polymerization of the epoxy/polyol by the Lewis acid generated by the combination of alpha-hydroxy-ketone reducing a large amount (greater depth) of the diaryl Iodomium salt.

An epoxy/polyol base was prepared as follows:

| | |
|---|---|
| ERL 4221 | 57.8 parts |
| TONE 0310 | 42.2 parts |
| CD 1012 | 1.0 parts |
| Iracure 184 | 3.0 parts |
| Total | 104 parts |

A number of peroxides were then added to the base and a series of test performed at a 1" inch fill level. The peroxides investigated were:

| | Trade Name | Chemical Name | Type |
|---|---|---|---|
| 1 | LUCIDO 98 | Benzoyl Peroxide | Diacyl Peroxide |
| 2 | | t-Butyl Perbenzoate | Peroxyester |
| 3 | | t-Amyl Perbenzoate | Peroxyester |
| 4 | LUPERSOL PDO | 50% t-Butyl Peroxy-2 ethylhexanoate | Peroxyester |
| 5 | LUPERSOL TBEC | 00-t-Butyl 1-(2-ethylhexyl) | Peroxyester |
| 6 | LUPERSOL TAEC | 00-t-Amyl-0-(2-ethylhexyl) Monoperoxy carbonate | Peroxyester |
| 7 | LUPERSOL 331-80B | 80% 1,1-Di-(t-Butylperoxy)-cyclohexane | Peroxyketal |
| 8 | LUPERSOL 531-80B | 80% 1,1-Di-(t-Amylperoxy)-1 cyclohexane | Peroxyketal |
| 9 | | 90% t-Butyl hydro-peroxide | Hydroperoxide |

The test results observed were as follows:

| | To 104 Parts Base Were Added: | Depth of Cure |
|---|---|---|
| 1 | 2.0 | 100 mils |
| 2 | 2.0 | 105 mils |
| 3 | 2.0 | 110 mils |
| 4 | 4.0 (50%) | 320 mils |
| 5 | 2.0 | 140 mils |
| 6 | 2.0 | 220 mils |
| 7 | 2.5 (80%) | 630 mils |
| 8 | 2.5 (80%) | 1000 mils (full cure) |
| 9 | 2.2 (90%) | 145 mils |
| base | No peroxide | 110 mils |

Discussion of Results

Peroxide numbers 7 and 8, which are of the class of peroxyketals, worked the best result was provided by number 8, an amyl-peroxyketal, which gave a complete cure to 1" depth. To reach a 1" depth of cure for sample number 8 took only about 3 minutes post RT cure after UV light exposure to start the reaction at 1,000 mj/cm$^2$ dose with (D) bulb. While curing, a high exothermic reaction was observed.

EXAMPLE 2

This example demonstrates a evaluation using vinyl ethers. The use of vinyl ethers as base resins were evaluated with an iodomium salt, alpha-hydroxy-ketone and an amyl peroxyketal blend. Vinyl ethers can be cured by cationic reaction (polymerization) by a strong Lewis acid.

Base Formulae

| | | |
|---|---|---|
| VECTOMER VE 1214 | 100.0 | (polyester divinyl ether) |
| CD 1012 | 1.0 | VEEW = ~560 |
| IRGACURE 184 | 3.0 | |
| LUPERSOL 531-80B | 2.5 | |
| Total | 106.5 | |

Same procedure and chemicals used as in prior example.

Depth of Cure=1,000 mils (full cure)

Discussion of Results

By using an iodomium salt, alpha-hydroxy-ketones and amylperoxy ketal blend, complete deep reaction curing was achieved in a vinyl ether cationic cure system.

EXAMPLE 3

Using a similar epoxy/polyol system to example 1, evaluation of the sensitization of diaryl iodonium-antimonate salt in an epoxy/polyol system was made. Also evaluated were use of different wavelengths of UV light using different fusion systems bulbs@1,000 mj/cm$^2$ dose over 250–415 mm to increase cure of systems.

Various Commercial Free Radical Generators (Not Alpha-Ketones)

| | Run Number | | | | | | | | | | | | | |
|---|---|---|---|---|---|---|---|---|---|---|---|---|---|---|
| | 1 | 2 | 3 | 4 | 5 | 6 | 7 | 8 | 9 | 10 | 11 | 12 | 13 | 14 |
| ELR 4221 | 57.8 | | | | | | | | | | | | | 57.8 |
| TONE 0310 | 42.2 | | | | | | | | | | | | | 42.2 |
| CD 1012 | 100.1.0 | | | | | | | | | | | | | 1.0 |
| ITX | | 1.0 | | | | | | | | | | | | |
| CQ | | | 1.0 | | | | | | | | | | | |
| BP | | | | 1.0 | | | | | | | | | | |
| DEAP | | | | | 1.0 | | | | | | | | | |
| I819 | | | | | | 1.0 | | | | | | | | |
| BDK | | | | | | | 1.0 | | | | | | | |

Various Alpha Ketones

| | Run Number | | | | | | | | | | | | | |
|---|---|---|---|---|---|---|---|---|---|---|---|---|---|---|
| | 1 | 2 | 3 | 4 | 5 | 6 | 7 | 8 | 9 | 10 | 11 | 12 | 13 | 14 |
| D1173 | | | | | | | | 1.0 | | | | | | |
| IRGACURE 2959 | | | | | | | | | 1.0 | | | | | |
| KIP 150 | | | | | | | | | | 1.0 | | | | |
| IRGACURE 184 | | | | | | | | | | | 1.0 | | | |

Other Free Radical Generators (Not Alpha-Ketones)

| | Run Number | | | | | | | | | | | | | |
|---|---|---|---|---|---|---|---|---|---|---|---|---|---|---|
| | 1 | 2 | 3 | 4 | 5 | 6 | 7 | 8 | 9 | 10 | 11 | 12 | 13 | 14 |
| IRGACURE 369 | | | | | | | | | | | | 1.0 | | |
| IRGACURE 907 | | | | | | | | | | | | | 1.0 | |
| ODAB | | | | | | | | | | | | | | 1.0 |

| | Results | | | | | | | | | | | | | |
|---|---|---|---|---|---|---|---|---|---|---|---|---|---|---|
| Cure 1000 mj | Result: g cured per 4 g of sample per bulb | | | | | | | | | | | | | |
| H Bulb | 0.60 | 0.50 | 0.83 | 0.73 | 1.14 | 0.24 | 1.27 | 3.50 | 2.78 | 2.81 | 3.29 | 0.40 | 0.30 | No Cure |
| D Bulb | 0.39 | 0.39 | 0.49 | 1.12 | 1.42 | 0.25 | 1.35 | 3.99 | 2.42 | 2.19 | 3.77 | | | No Cure |
| V Bulb | 0.40 | 1.36 | 2.06 | 1.13 | 1.42 | 0.19 | 1.58 | 3.69 | 2.10 | 2.10 | 3.65 | | | No Cure |

Discussion of Results

The Iodonium salt can be sensitized by some free-radical PIs. However, in the case of alpha-hydroxy-ketone, this is the most effective i.e. see results for samples 8–11. This is likely due to the fact that the alpha-hydroxy radical that is produced directly reduces the Iodonium salt, thus generating a very strong Lewis acid. The longer wavelength absorption of the alpha-hydroxy-ketone PI give a deeper UV penetration into the mass of the epoxy potting material producing a large exotherm which also will increase the reactivity of the Lewis acid.

While the invention has been described with reference to specific embodiments, it will be apparent to those skilled in the art that many modifications and variations may be made. Accordingly, the present invention is intended to embrace all such alternatives, modifications and variation that may fall within the spirit and scope of the appended claims and equivalent thereof.

What is claimed is:

1. A liquid resin composition curable by ultraviolet light comprising:
   a) from 25 to 95% by weight of a liquid resin selected from the group consisting of cycloaliphatic expoxides, vinyl ethers and mixtures thereof with epoxy polyolefins,
   b) when component (a) contains a cycloaliphatic epoxide, from 1 to 70% by weight of a hydroxy-functional material that will react with the liquid resin of component a);
   c) from 0.1 to 10% by weight of one or more iodonium salts that produce Lewis acid upon the application of ultraviolet light;
   d) from 0.1 to 5.0% by weight of one or more alpha-hydroxy-ketones which sensitizes component c) to increase its reactivity and
   e) from 0.2 to 5.0% by weight of an organic peroxide that has a ten hour half-life at about 65° C. to 110° C.

2. The composition of claim 1 wherein the resin of subparagraph a) is a cycloaliphatic expoxide.

3. The composition of claim 2 wherein the hydroxy-functional material of subparagraph b) has a hydroxyl functionality of at least 1.

4. The composition of claim 1 wherein the iodonium salt is diaryl iodonium hexafluoroantimonate.

5. The composition of claim 1 where the material of subparagraph d) is selected from the group consisting of 1-hydroxylcyclohexyl ketone ($C_{13}H_{16}O_2$) and 2-hydroxyl-2-methyl-phenyl-propane-1 ketone ($C_{10}H_{12}O_2$).

6. A liquid resin composition curable by ultraviolet light comprising:
   a) from 80 to 99.6% by weight of a liquid resin selected from the group of vinyl ethers and mixtures thereof with epoxy polyolefins,
   b) from 0.1 to 10% by weight of one or more iodonium salts that produce Lewis acid upon the application of ultraviolet light;
   c) from 0.1 to 5.0% by weight of one or more alpha-hydroxy-ketones which sensitizes component c) to increase its reactivity; and
   d) from 0.2 to 5.0% by weight of an organic peroxide that has a ten hour half-life at about 65° C. to 110° C.

7. The composition of claim 6 wherein the cationic photoinitiator is diaryl iodonium hexafluorantimonate.

8. The composition of claim 6 where the of subparagraph c) is selected from the group consisting of 1-hydroxylcyclohexyl ketone ($C_{13}H_{16}O_2$) and 2-hydroxyl-2-methyl-phenyl-propane-1 ketone ($C_{10}H_{12}O_2$).

9. A liquid resin composition curable by ultraviolet light comprising:
   a) from 25 to 95% by weight of a liquid resin selected from the group consisting of cycloaliphatic expoxides, vinyl ethers and mixtures thereof with epoxy polyolefins,
   b) when component (a) contains a cycloaliphatic epoxide, from 1 to 70% by weight of a hydroxy-functional material that will react with the liquid resin of component a) selected from the group consisting of alkanols, monoalkyl ethers of polyoxyalkyleneglycols, monoalkyl ethers of alkylene-glycols, polycaprolactones and mixtures thereof;
   c) from 0.1 to 10% by weight of one or more iodonium salts;
   d) from 0.1 to 5.0% by weight of one or more alpha-hydroxy-ketones and e) from 0.2 to 5.0% by weight of a peroxide selected from the group consisting of 1,1-di(t-butylperoxyl-cyclohexane) and 1,1-di(t-amyperoxyl-cyclohexane).

10. The composition of claim 9 wherein the resin of subparagraph a) is a cycloaliphatic expoxide.

11. The composition of claim 9 wherein the hydroxy-functional material of subparagraph b) has a hydroxyl functionality of at least 1.

12. The composition of claim 9 wherein the iodonium salt is diaryl iodonium hexafluoroantimonate.

13. The composition of claim 9 where the alpha-hydroxy ketone of subparagraph d) is selected from the group of 1-hydroxycyclohexyl ketone ($C_{13}H_{16}O_2$) and 2-hydroxyl-2-methyl-phenyl-propane-1 ketone ($C_{10}H_{12}O_2$).

14. A composition of matter comprising:
   a) from 0.1 to 10% by weight of one or more iodonium salts that produce Lewis acid upon the application of ultraviolet light,
   b) from 0.1 to 5.0% by weight of one or more alpha-hydroxy-ketones which sensitizes component c) to increase its reactivity and
   c) from 0.2 to 5.0% by weight of an organic peroxide that has a ten hour half-life at about 65° C. to 110° C.

15. The composition of claim 14 wherein the iodonium salt is diaryl iodonium hexafluoroantimonate.

16. The composition of claim 14 where one of the alpha-hydroxy-ketones is selected from the group consisting of 1-hydroxycyclohexyl ketone ($C_{13}H_{16}O_2$) and 2-hydroxyl-2-methyl-phenyl-propane-1 ketone ($C_{10}H_{12}O_2$).

17. The composition of claim 14 wherein the organic peroxide of subparagraph c) is 1,1-di(t-butylperoxyl cyclohexane).

* * * * *